United States Patent
Lee

(10) Patent No.: US 7,087,993 B2
(45) Date of Patent: Aug. 8, 2006

(54) CHIP PACKAGE AND ELECTRICAL CONNECTION STRUCTURE BETWEEN CHIP AND SUBSTRATE

(75) Inventor: Sheng-Yuan Lee, Taipei (TW)

(73) Assignee: Via Technologies, Inc., Taipei (TW)

(*) Notice: Subject to any disclaimer, the term of this patent is extended or adjusted under 35 U.S.C. 154(b) by 37 days.

(21) Appl. No.: 11/000,220

(22) Filed: Dec. 1, 2004

(65) Prior Publication Data

US 2005/0121752 A1 Jun. 9, 2005

(30) Foreign Application Priority Data

Dec. 5, 2003 (TW) ............................. 92134273 A

(51) Int. Cl.
*H01L 23/34* (2006.01)

(52) U.S. Cl. ..................................... 257/728; 257/786

(58) Field of Classification Search ................. 257/728
See application file for complete search history.

(56) References Cited

U.S. PATENT DOCUMENTS 5,371,405 A * 12/1994 Kagawa ...................... 257/664

\* cited by examiner

*Primary Examiner*—Tu-Tu Ho
(74) *Attorney, Agent, or Firm*—Troxell Law Office, PLLC

(57) ABSTRACT

A chip package comprising a lead frame, a chip, a plurality of generic wires, a plurality of AC ground wires, at least a characterized signal wire and an insulation material is provided. The lead frame comprises a die pad, a plurality of generic leads, a plurality of AC ground leads and at least a characterized signal lead structure. Both sides of the characterized signal lead structure are AC ground leads. The characterized signal lead structure has a cross-sectional area perpendicular to the direction where signals transmit, which is larger than that of each generic lead. The chip is attached to the die pad. The generic wires respectively connect the chip to the generic leads. The AC ground wires respectively connect the chip to the AC ground leads. The characterized signal wires connect the chip to the characterized signal lead structure. The characterized signal wires are used for transmitting an identical signal between the chip and the characterized signal lead structure. The insulation material encapsulates the lead frame, the chip, the generic wires, the AC ground wires and the characterized signal wires.

22 Claims, 17 Drawing Sheets

| Frequency | 2.5GHz | | 5GHz | | 10GHz | |
|---|---|---|---|---|---|---|
| Value | S22(dB) | S21(dB) | S22(dB) | S21(dB) | S22(dB) | S21(dB) |
| FIG. 1B | -18.6 | -0.16 | -12.9 | -0.41 | -6.7 | -1.46 |
| FIG. 3 | -26.6 | -0.09 | -20.1 | -0.19 | -10.4 | -0.76 |
| FIG. 4B | -32 | -0.09 | -21.8 | -0.19 | -7.8 | -1.18 |

| Frequency | 2.5GHz | | 5GHz | | 10GHz | |
|---|---|---|---|---|---|---|
| Value | S22(dB) | S21(dB) | S22(dB) | S21(dB) | S22(dB) | S21(dB) |
| Fig.4B | -32 | -0.09 | -21.8 | -0.19 | -7.8 | -1.18 |
| Case I | -35.9 | -0.09 | -24.3 | -0.18 | -8.7 | -1.02 |
| Case II | -38.6 | -0.09 | -27.1 | -0.17 | -9.4 | -0.93 |
| Case III | -38.2 | -0.09 | -31.9 | -0.16 | -10.3 | -0.83 |
| Case IV | -33.1 | -0.09 | -34.8 | -0.16 | -10.3 | -0.82 |

CHIP PACKAGE AND ELECTRICAL CONNECTION STRUCTURE BETWEEN CHIP AND SUBSTRATE

BACKGROUND OF THE INVENTION

1. Field of the Invention

The present invention relates to a chip package and an electrical connection structure between a chip and a substrate. More particularly, the present invention relates to a high performance chip package and electrical connection structure between a chip and a substrate.

2. Description of the Related Art

FIG. 1A is a schematic cross-sectional view of a conventional chip package with a chip electrically connected to a lead frame using a wire-bonding process. FIG. 1B is a perspective view of the electrical connection structure between a chip and a substrate shown in FIG. 1A. As shown in FIGS. 1A and 1B, chip package 100 comprises chip 110, lead frame 120, signal wire 130a, ground wires 130b and insulation material 150. Lead frame 120 has die pad 122 and a plurality of identical leads 124.

To enhance the electrical characteristic between chip 110 and substrate 190, ground bonding pad 135 surrounding signal bonding pad 133 is being arranged on chip 110. Thus, a high-frequency signal is being transmitted from signal bonding pad 133 to lead 124a using a signal wire and finally being fed into substrate 190 through pad 192, in addition, ground signals are being outputted from ground bonding pad 135 in parallel, and further being respectively transmitted to lead 124b using ground wires, and finally respectively being shorted to ground through pad 194. In this regard, the grounding path of the high-frequency signal can be shorten by the neighboring grounding loop such that the signal distortion is reduced and consequently the electrical characteristic between chip 110 and substrate 190 is enhanced. Die pad 122 and lead 124b are electrically connected through pad 194 on substrate 190 to provide an electrical ground. Insulation material 150 encapsulates chip 110, lead frame 120, signal wire 130a and ground wires 130b.

As shown in FIG. 1B, ground wires 130b are located at both sides of signal wire 130a to serve as an electrical shield. Ground wires 130b not only minimizes external electrical interference to signal wire 130a during signal transmission, but also prevents signal wire 130a from causing interference to other wires. Because signal wire 130a has a small cross-sectional area and a long length, relatively high impedance is produced during high frequency signal transmission. When the impedance of signal wire 130a deviates significantly from the system impedance, serious signal reflection occurs and the probability of producing computation errors in chip 110 increases considerably.

FIG. 2A is a schematic cross-sectional view of another conventional chip package with a chip electrically connected to a lead frame using a wire-bonding process. FIG. 2B is a perspective view of the electrical connection structure between a chip and a substrate shown in FIG. 2A. The chip package is almost identical to the one in FIGS. 1A and 1B except for the bonding of additional ground wires 140 linking chip 110 and die pad 122.

A conventional method used to improve the electrical characteristic of the aforementioned chip package 100 is to output high-frequency signals in parallel. Please refer to FIG. 3, which is a perspective view showing the double bonding-wire electrical connection structure between a chip and a substrate shown in FIGS. 1B and 2B. Instead of outputting a high-frequency signal of chip 110 through a single signal wire in FIGS. 1B and 2B, the high-frequency signals are being outputted in parallel using two signal wires in chip package 100, that is, signal bonding pad 133 of chip 110 is being connected to lead 124a of substrate 190 using two signal wires. As the result, the parasitic inductances induced respectively by the two parallel signal wires are parallel-connected, such that the capacitance and inductance between chip 110 and substrate 190 are better matched to have a better circuit performance.

However, to fabricate the foregoing improved chip package 100 of FIG. 3 is difficult in reality. For instance, both the surfaces of signal bonding pad 133 and lead 124a available for bonding are small such that the two signal wires connecting signal bonding pad 133 and lead 124a are very close to each other, and consequently reduces circuit performance thereof since not only the bonding is not easy to implement, but also the two signal wires are likely to contact with each other while applying a molding compound onto chip package 100.

SUMMARY OF THE INVENTION

Accordingly, the present invention is to provide a chip package and an electrical connection structure between a chip and a substrate capable of matching the impedance between a chip and a substrate with the system impedance.

To achieve these and other advantages and in accordance with the purpose of the invention, as embodied and broadly described herein, the invention provides a chip package. The chip package comprises a lead frame, a chip, a plurality of generic wires, a plurality of AC (Alternating current) ground wires, at least a characterized signal wire and an insulation material. The lead frame comprises a die pad, a plurality of generic leads, a plurality of AC ground leads and at least a characterized signal lead structure. The characterized signal lead structure has a cross-sectional area perpendicular to the direction where signals transmit, which is larger than that of each generic lead, wherein both sides of the characterized signal lead structure are the AC ground leads.

The chip is attached to the die pad. The generic wires respectively connect the chip to the generic leads. The AC ground wires connect at least a AC ground bonding pad on the chip to the AC ground leads respectively for transmitting at least a AC ground signal, wherein the AC ground bonding pad comprises ground bonding pad and power bonding pad, the AC ground signal comprises ground signal and power signal. The AC ground signals are substantially ground signals in AC mode. The characterized signal wire connects a signal bonding pad on the chip to the characterized signal lead structure for transmitting a single signal, wherein the signal bonding pad on the chip is surrounded by the AC ground bonding pad. The AC ground wires are located at both sides of the characterized signal wires to serve as an electrical shield for not only minimizing external electrical interference to the characterized signal wire during signal transmission but also preventing the characterized signal wire from causing interference to other wires.

In addition, the chip package further comprises a plurality of ground wires connected to an electrical ground, and the ground wires are connected between the chip and the die pad and positioned at both sides of the characterized signal wires. The insulation material encapsulates the lead frame, the chip, the generic wires, the AC ground wires, the characterized signal wire and the ground wires.

According to one preferred embodiment of this invention, the chip package comprises a plurality of characterized signal wires and the characterized signal lead structure comprises a plurality of characterized signal leads. The characterized signal leads have a profile identical to the generic leads. The characterized signal wires connect the same signal bonding pad on the chip to the characterized signal leads respectively. Furthermore, according to another embodiment of this invention, the characterized signal lead structure is a single block lead.

In this present invention, the characterized signal lead structure is electrically connected to a pad of a substrate, wherein the pad is electrically connected to a transmission line of the substrate, the transmission line has characteristic of stepped impedance. The transmission line comprises a first section electrically connected to the pad and a second section electrically connected to the first section, wherein the first section and the second section have different impedance. The width of the first section is smaller than that of the second section.

In brief, because the characterized signal lead structure is fabricated with a considerable volume, a capacitive effect is easily induced to compensate for the inductive effect of characterized signal wires. A transmission line connected to the characterized signal lead structure could be used to increase the inductance to balance the over tuned capacitance of the characterized signal lead structure by adjusting the widths of the segments of the transmission line. Hence, the impedance between the chip and the substrate can approximately match the impedance of the system. Therefore, computation errors in the chip due to signal reflection are significantly minimized.

Both the foregoing general description and the following detailed description are exemplary and explanatory only and are not restrictive of the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
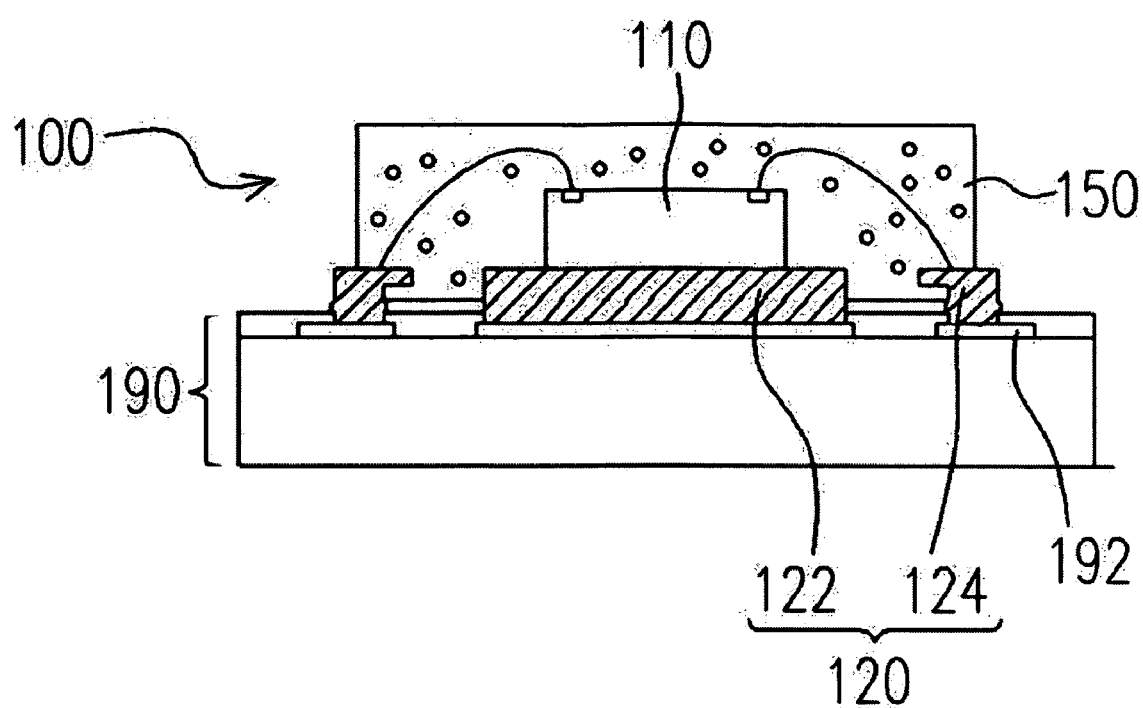
FIG. 1A is a schematic cross-sectional view of a conventional chip package with a chip electrically connected to a lead frame using a wire-bonding process.
Figure 1B:
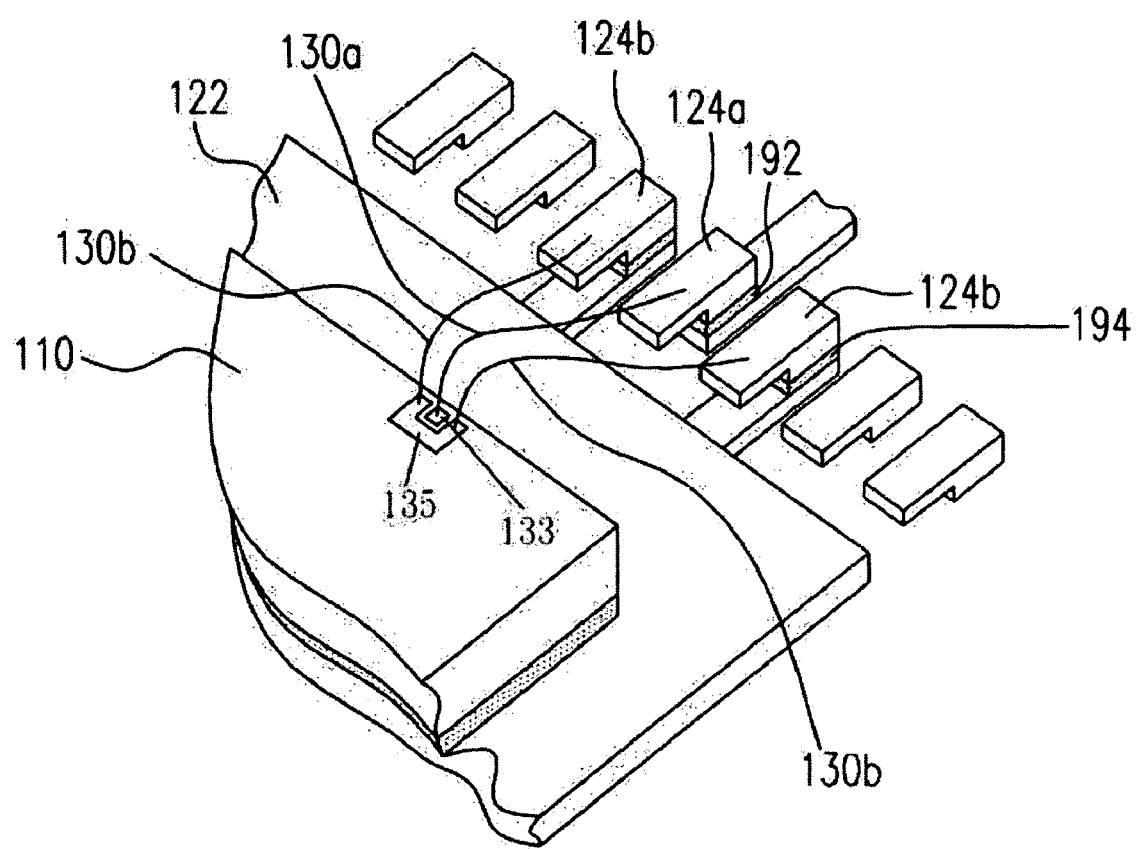
FIG. 1B is a perspective view of the electrical connection structure between a chip and a substrate shown in FIG. 1A.
Figure 2A:
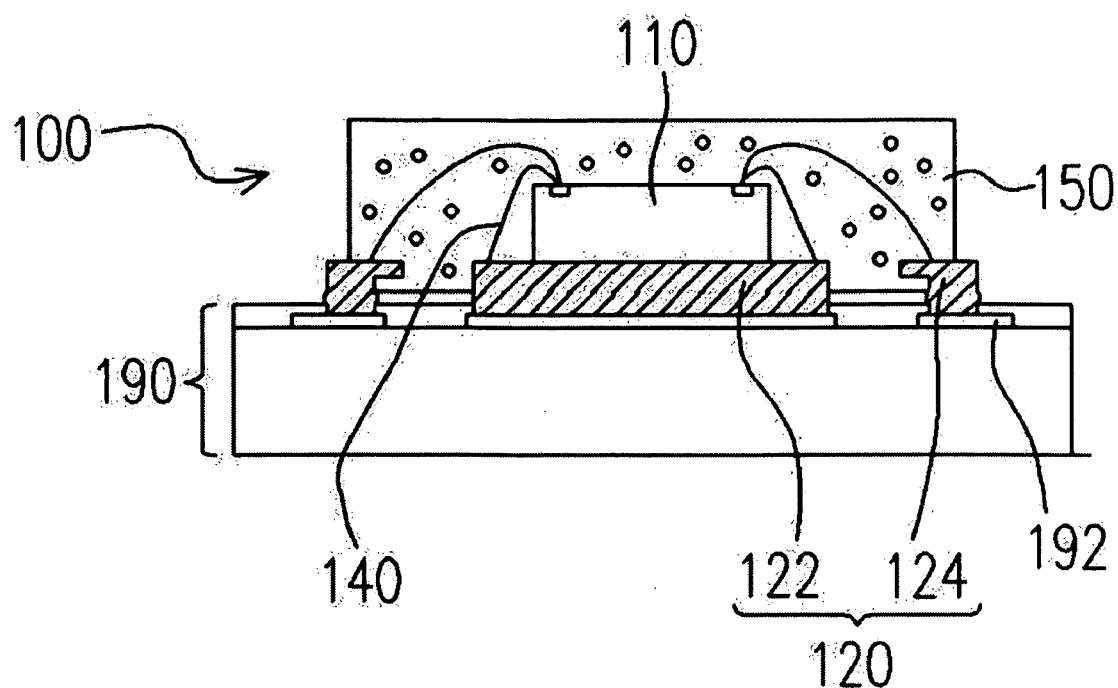
FIG. 2A is a schematic cross-sectional view of another conventional chip package with a chip electrically connected to a lead frame using a wire-bonding process.
Figure 2B:
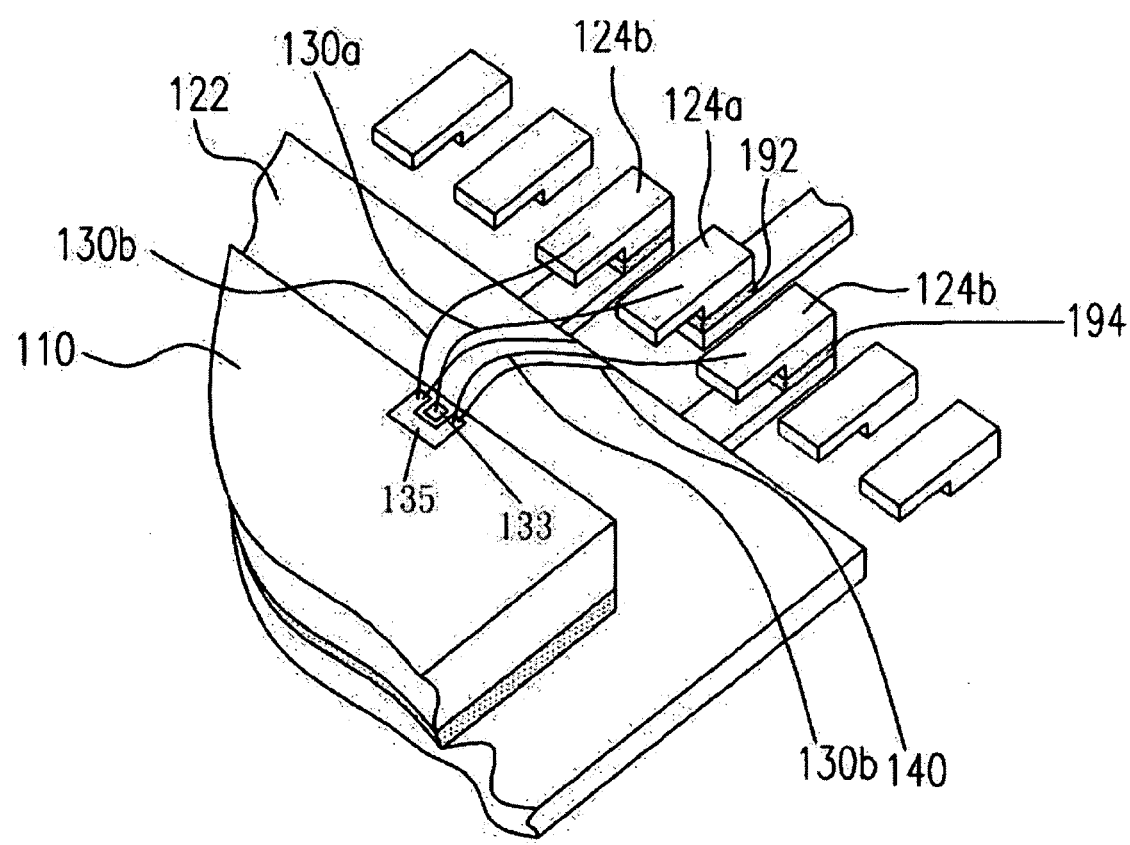
FIG. 2B is a perspective view showing the electrical connection structure between a chip and a substrate shown in FIG. 2A.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 4A:
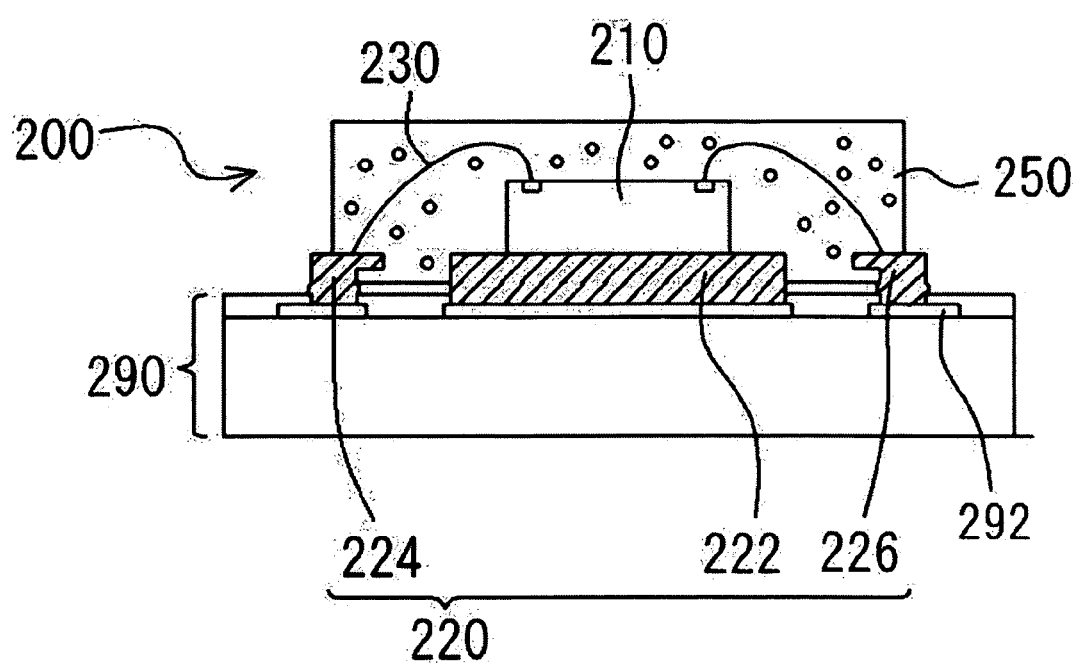
FIG. 4A is a schematic cross-sectional view of a chip package with a chip electrically connected to a lead frame using a wire-bonding process according to a first preferred embodiment of this invention.
Figure 4B:
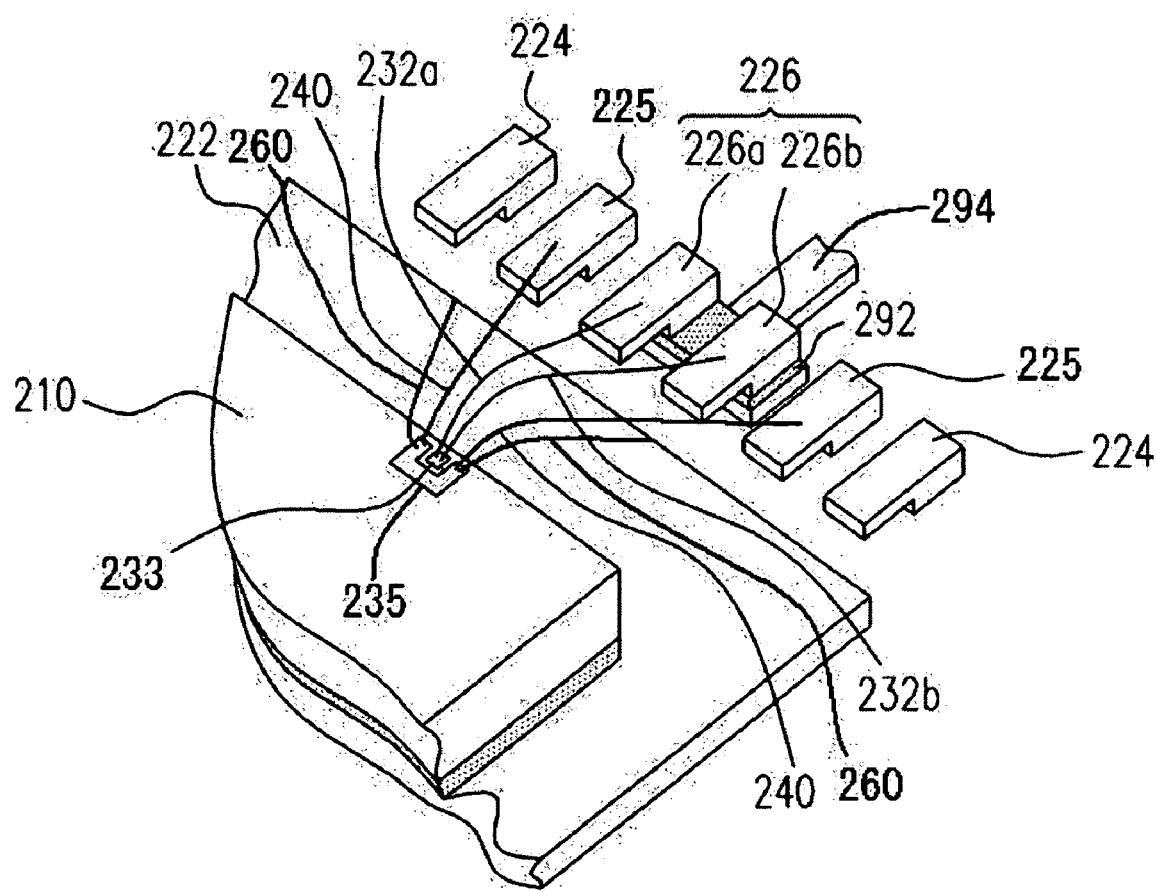
FIG. 4B is a perspective view showing the electrical connection structure between a chip and a substrate according to the first preferred embodiment of this invention.
Figure 4C:
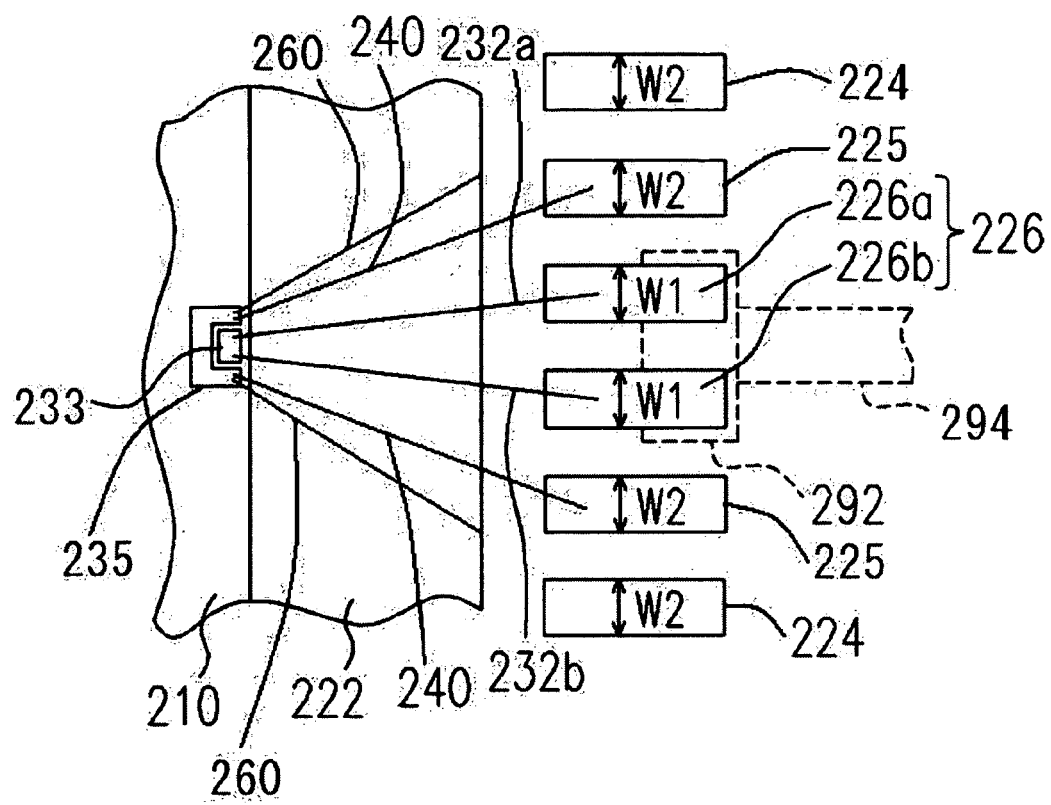
FIG. 4C is a top view showing the electrical connection structure between a chip and a substrate according to the first preferred embodiment of this invention.

FIG. 4A is a schematic cross-sectional view of a chip package with a chip electrically connected to a lead frame using a wire-bonding process according to a first preferred embodiment of this invention. FIG. 4B is a perspective view showing the electrical connection structure between a chip and a substrate according to the first preferred embodiment of this invention. FIG. 4C is a top view showing the electrical connection structure between a chip and a substrate according to the first preferred embodiment of this invention.

As shown in FIGS. 4A, 4B and 4C, chip package 200 comprises chip 210, lead frame 220, a plurality of generic wires 230, a plurality of AC ground wires 240, characterized signal wires 232a, 232b and insulation material 250. Lead frame 220 comprises die pad 222, a plurality of identical generic leads 224, a plurality of AC ground leads 225 and at least a characterized signal lead structure 226. In this embodiment, characterized signal lead structure 226 is composed of two characterized signal leads 226a and 226b. The characterized signal leads 226a and 226b have a shape identical to the generic leads 224. Furthermore, the characterized signal leads 226a and 226b have a width W1 identical to the width W2 of the generic leads 224 and the width W2 of the AC ground leads 225. The two characterized signal leads 226a, 226b have a combined cross-sectional area perpendicular to the direction where signals transmit, which is greater than that of each generic lead 224. In other words, the characterized signal lead structure 226 has a cross-sectional area perpendicular to the direction where signals transmit, which is greater than that of each generic lead 224. Both sides of characterized signal lead structure 226 are AC ground leads 225.

Chip 210 is attached to die pad 222. Generic wires 230 respectively connect chip 210 to generic leads 224. AC ground wires 240 connect at least a AC ground bonding pad 235 on chip 210 to AC ground leads 225 respectively for transmitting at least a AC ground signal, wherein AC ground bonding pad 235 comprises ground bonding pad and power bonding pad, the AC ground signal comprises ground signal and power signal. The AC ground signals are substantially ground signals in AC mode. For example, AC ground leads 225 positioned at both sides of characterized signal lead structure 226 could be both ground leads, or both power leads, or one ground lead, one power lead. Characterized signal wire 232a and 232b connects signal bonding pad 233 on chip 210 to characterized signal leads 226a and 226b for transmitting a single signal, wherein signal bonding pad 233 on chip 210 is surrounded by AC ground bonding pad 235. AC ground wires 225 are located at both sides of characterized signal wires 232a and 232b to serve as an electrical shield for not only minimizing external electrical interference to characterized signal wires 232a and 232b during signal transmission but also preventing characterized signal wires 232a and 232b from causing interference to other wires.

In addition, chip package 200 further comprises a plurality of ground wires 260 connected to an electrical ground, and ground wires 260 are connected between chip 210 and die pad 222 and positioned at both sides of characterized signal wires 232a and 232b. Insulation material 250 encapsulates lead frame 220, chip 210, generic wires 230, AC ground wires 240, characterized signal wires 232a and 232b and ground wires 260. Characterized signal leads 226a and 226b are electrically connected to pad 292 of substrate 290.

However, characterized wires 232a, 232b have a small cross-sectional area and a long length, an inductive effect is prominent during signal transmission. In this invention, characterized signal lead structure 226 has considerable volume that induces capacitive effect that compensates for the inductive effect of characterized signal wires 232a and 232b. Thus, the transmission circuit combining characterized wires 232a, 232b with characterized lead structure 226 can provide an impedance close to the system impedance. In other words, computation errors in the chip is due to signal reflection are significantly minimized.

In general, signal bonding pad 233 on chip 210 may be electrically connected to a plurality of characterized signal leads through a plurality of characterized signal wires. For example, signal bonding pad 233 on chip 210 may be electrically connected to three characterized signal leads through three characterized signal wires. That means, a same signal can be transmitted from signal bonding pad 233 on chip 210 to pad 292 of substrate 290 through three characterized signal wires and three characterized signal leads. It can compensate for the inductive effect caused by using just one signal wire to transmit in a conventional design, i.e. FIGS. 1A, 1B, 2A and 2B.

Figure 5:
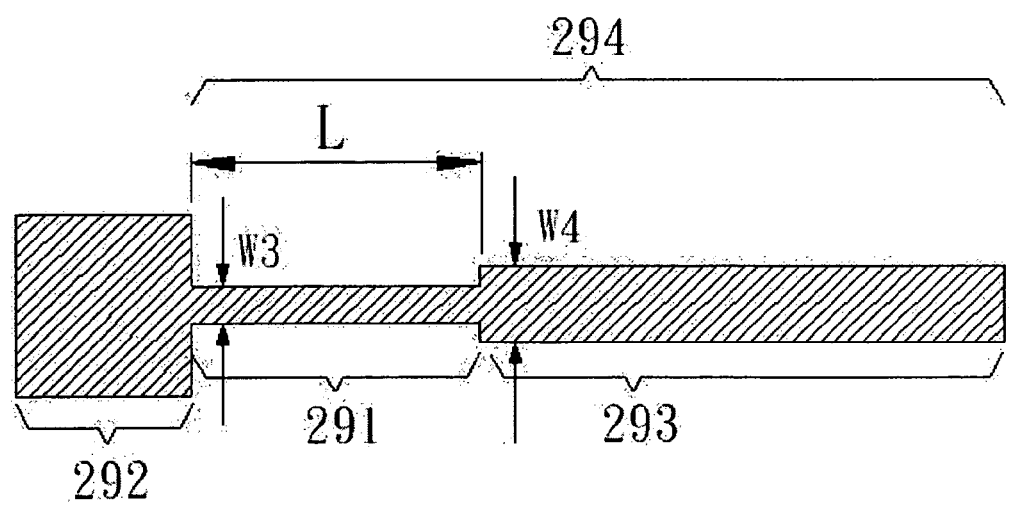
FIG. 5 is a top view showing transmission line 294 of FIGS. 4B and 4C.

A transmission line 294 connected to pad 292 of substrate 290 could be used to increase the inductance to balance the over tuned capacitance of characterized signal lead structure 226. Please refer to FIG. 5, which is a top view showing transmission line 294 of FIGS. 4B and 4C. Modify the structure of transmission line 294 as FIG. 5 to increase the inductance. Transmission line 294 has characteristic of stepped impedance and comprises a first section 291 electrically connected to pad 292 and a second section 293 electrically connected to first section 291, wherein first section 291 and second section 293 have different impedance. The width W3 of first section 291 is smaller than the width W4 of second section 293.

Adjusting the widths W3 and W4 of the segments of transmission line 294 to increase the inductance, so that the transmission circuit combining characterized wires 232a, 232b, characterized lead structure 226 and transmission line 294 can provide an impedance close to the system impedance. Therefore, computation errors in chip 210 due to signal reflection are significantly minimized.

Second Embodiment

Figure 6:
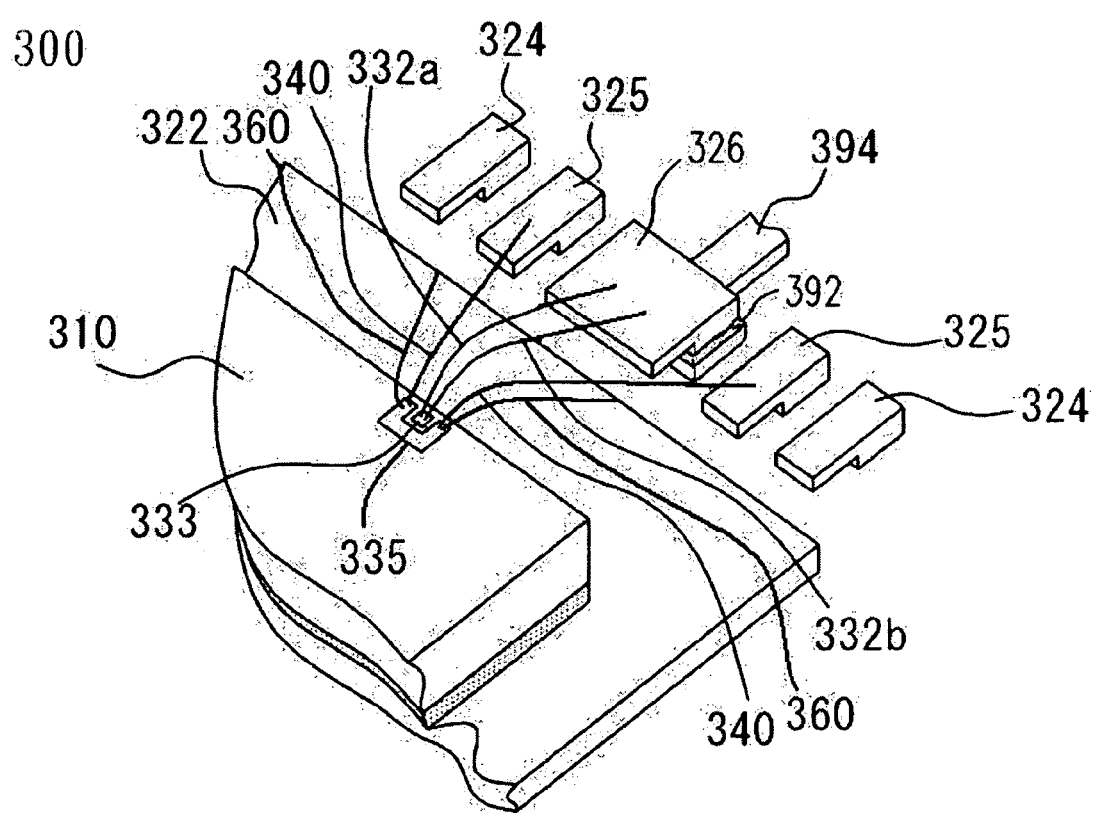
FIG. 6 is a perspective view showing the electrical connection structure between a chip and a substrate according to a second preferred embodiment of this invention.
Figure 7:
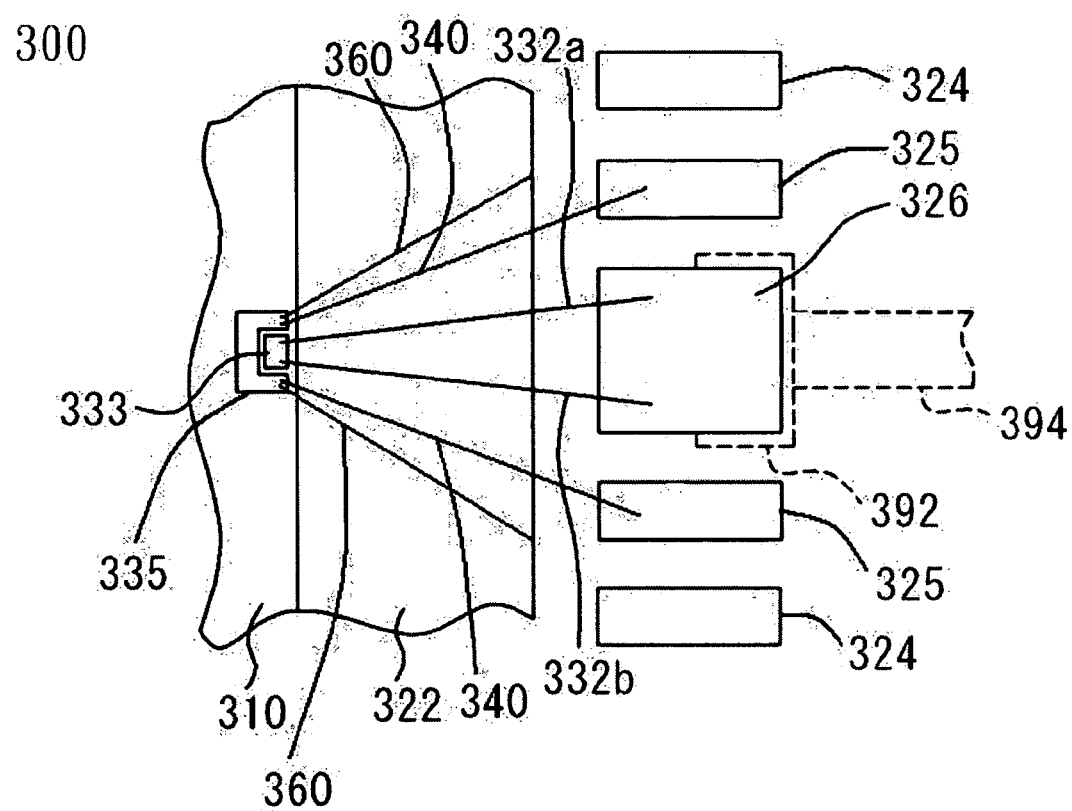
FIG. 7 is a top view showing the electrical connection structure between a chip and a substrate according to the second preferred embodiment of this invention.

FIG. 6 is a perspective view showing the electrical connection structure between a chip and a substrate according to a second preferred embodiment of this invention. FIG. 7 is a top view showing the electrical connection structure between a chip and a substrate according to the second preferred embodiment of this invention. This embodiment differs from the first embodiment mainly in the design of the characterized signal lead structure. Since all other elements are identical to that of the first embodiment, detail descriptions of these elements are omitted.

As shown in FIGS. 6 and 7, characterized signal lead structure 326 is fabricated as a single block lead. Characterized signal lead structure 326 has a cross-sectional area perpendicular to the direction where signals transmit, which is greater than that of each generic lead 324. Both sides of characterized signal lead structure 326 are AC ground leads 325. Characterized signal wire 332a and 332b connects signal bonding pad 333 on chip 310 to characterized signal lead structure 326 for transmitting a single signal, wherein signal bonding pad 333 on chip 310 is surrounded by AC ground bonding pad 335.

In addition, chip package 300 further comprises a plurality of ground wires 360 connected to an electrical ground, and ground wires 360 are connected between chip 310 and die pad 322 and positioned at both sides of characterized signal wires 332a and 332b. Characterized signal lead structure 326 is electrically connected to pad 392 of substrate 390.

However, characterized wires 332a, 332b have a small cross-sectional area and a long length, an inductive effect is prominent during signal transmission. In this invention, characterized signal lead structure 326 has considerable volume that induces capacitive effect that compensates for the inductive effect of characterized signal wires 332a and 332b. Thus, the transmission circuit combining characterized wires 332a, 332b with characterized lead structure 326 can provide an impedance close to the system impedance. In other words, computation errors in the chip due to signal reflection are significantly minimized.

Figures 8, 9:
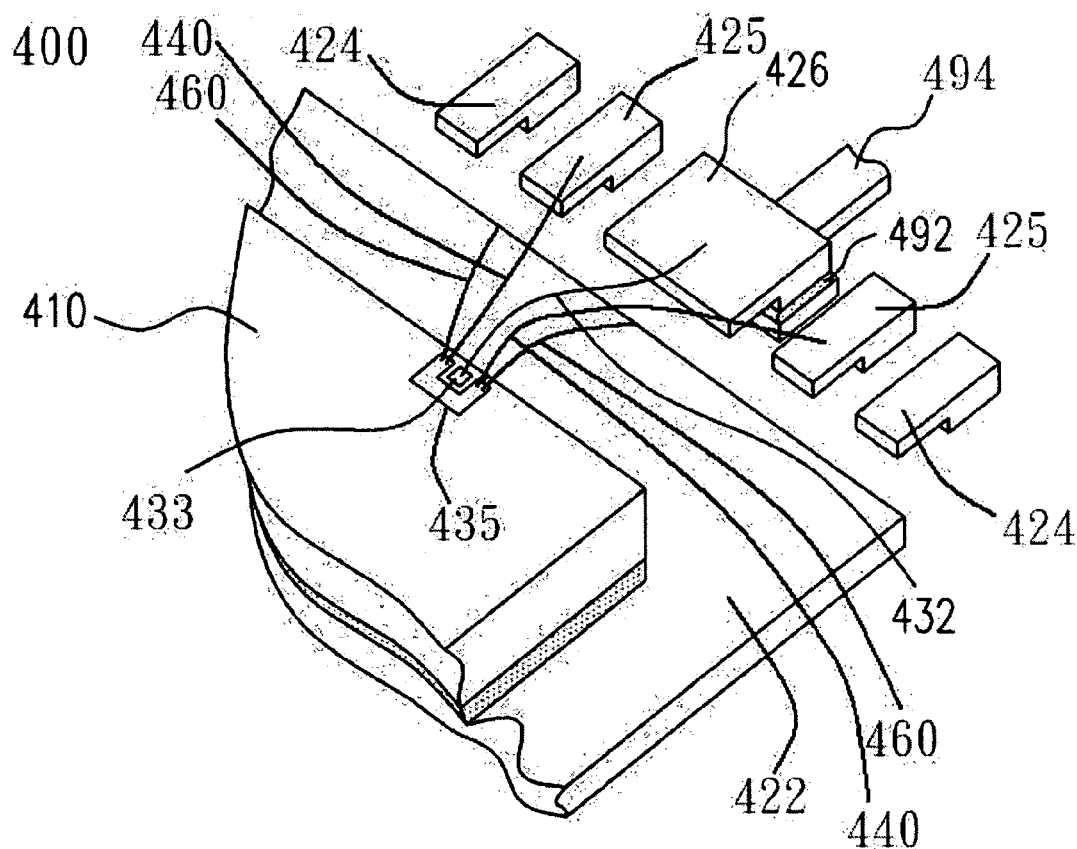
FIG. 8 is a perspective view showing an electrical connection structure between a chip and a substrate through a characterized signal wire according to the second preferred embodiment of this invention.
FIG. 9 is a table showing the frequency response value of the structures in FIG. 1B, FIG. 3 and FIG. 4B at operating frequencies 2.5 GHz, 5 GHz and 10 GHz respectively.

In general, signal bonding pad 333 on chip 310 may be electrically connected to single block characterized signal lead structure 326 through a plurality of characterized signal wires. For example, signal bonding pad 333 on chip 310 may be electrically connected to single block characterized signal lead structure 326 through three characterized signal wires. That means, a same signal can be transmitted from signal bonding pad 333 on chip 310 to pad 392 of substrate 390 through three characterized signal wires and single block characterized signal lead structure 326. However, an alternative setup shown in FIG. 8 is possible. FIG. 8 is a perspective view showing an electrical connection structure between a chip and a substrate through a characterized signal wire according to the second preferred embodiment of this invention. In FIG. 8, only one single characterized signal wire 432 is used to electrically connect signal bonding pad 433 on chip 410 to characterized signal lead structure 426 shaped as a single block lead. In other words, a same signal can be transmitted from signal bonding pad 433 on chip 410 to pad 492 of substrate 490 through characterized signal wire 432 and single block characterized signal lead structure 426.

A transmission line 394 connected to pad 392 of substrate 390 could be used to increase the inductance to balance the over tuned capacitance of characterized signal lead structure 326. Modify the structure of transmission line 394 as the structure of transmission line 294 in FIG. 5 to increase the inductance. Since the structure of transmission line 394 is identical to the structure of transmission line 294, detail descriptions are omitted.

Experiment Result

The electrical connection structure for connecting a chip to a substrate according to this invention and the conventional one is compared.

Figure 3:
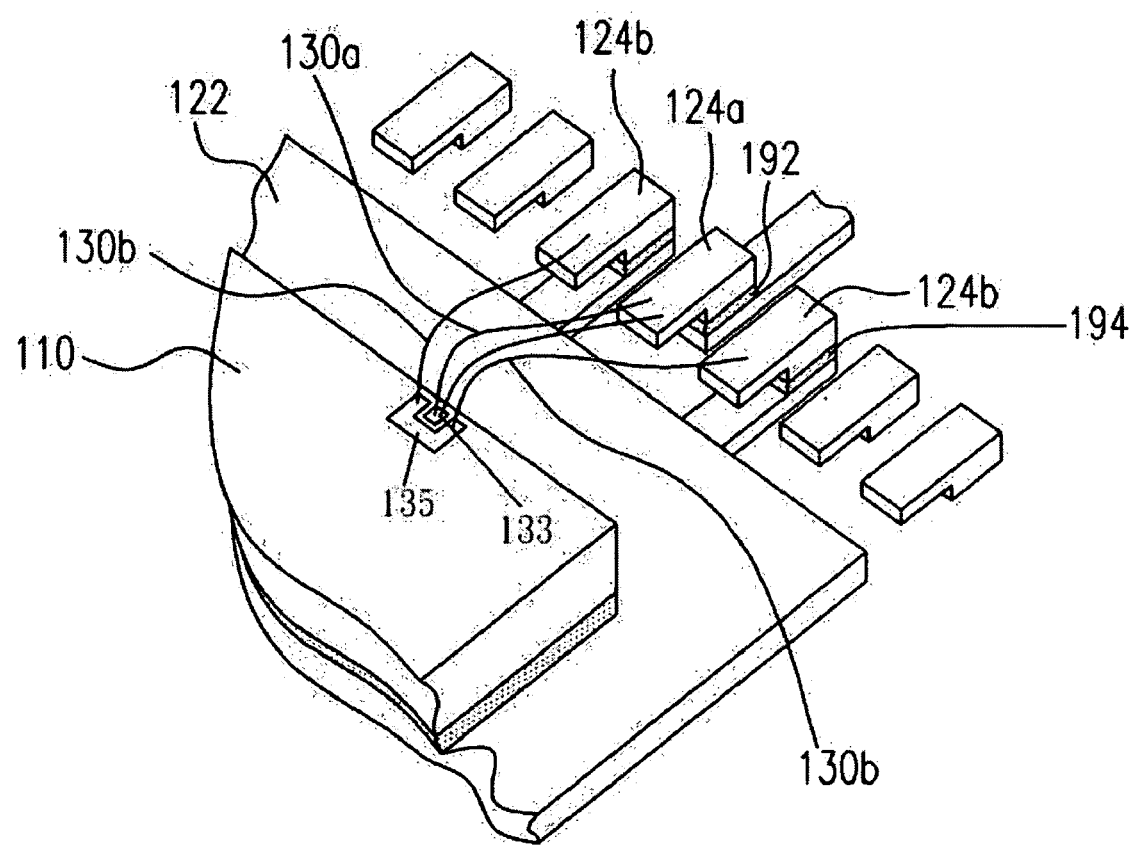
FIG. 3 is a perspective view showing the double bonding-wire electrical connection structure between a chip and a substrate shown in FIGS. 1B and 2B.
Figure 10:
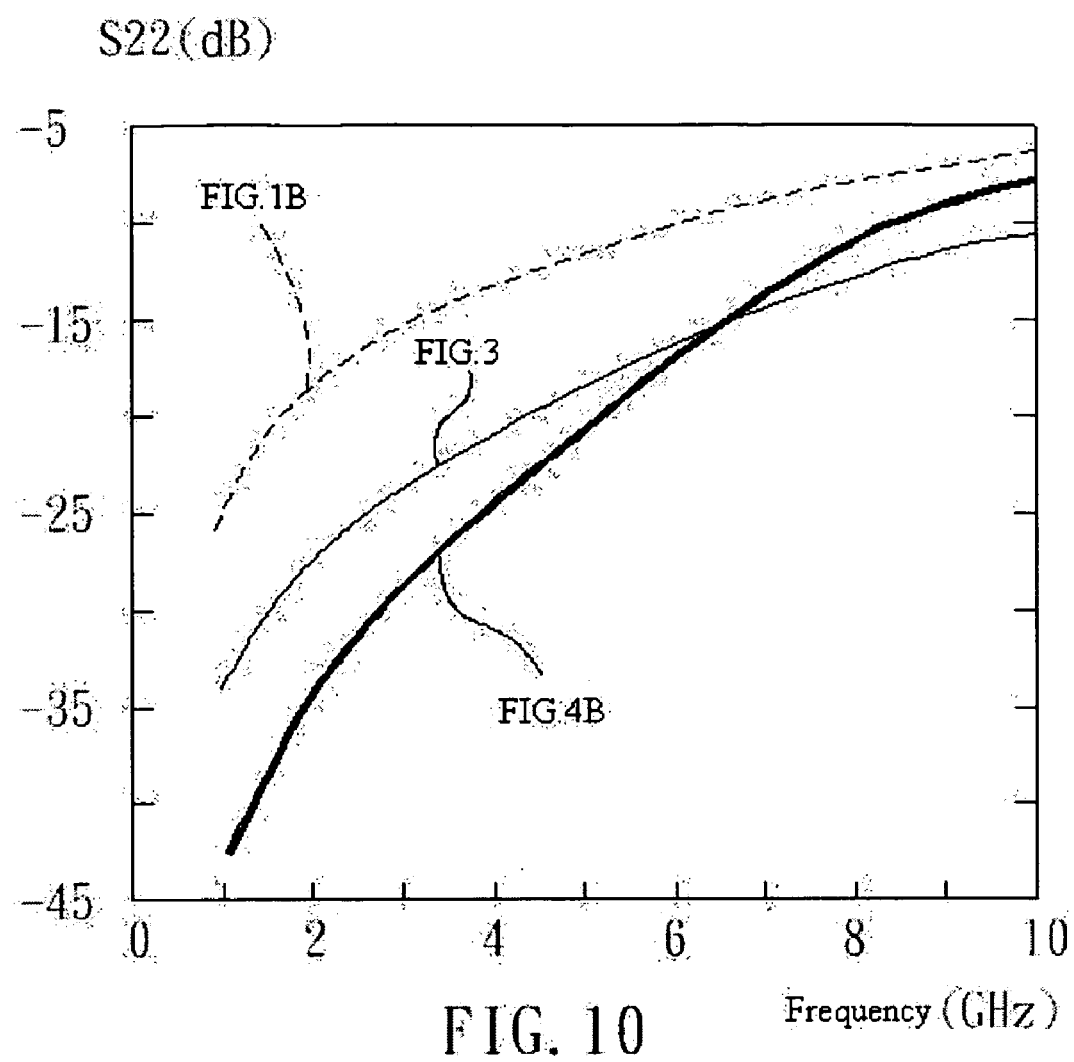
FIG. 10 is a graph showing the $S_{22}$ frequency response curves in FIG. 1B, FIG. 3 and FIG. 4B.
Figure 11:
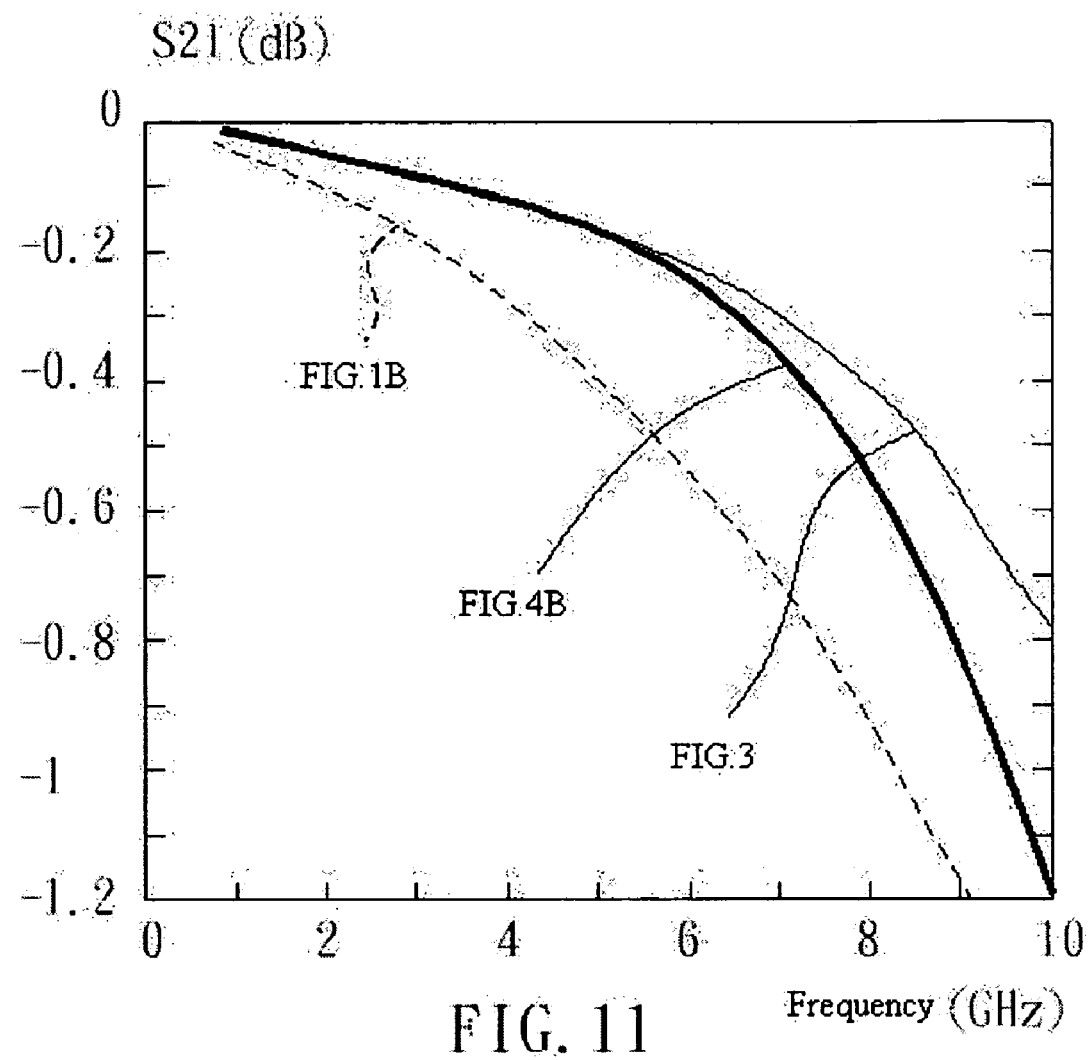
FIG. 11 is a graph showing the $S_{21}$ frequency response curves in FIG. 1B, FIG. 3 and FIG. 4B.
Figures 12, 13:
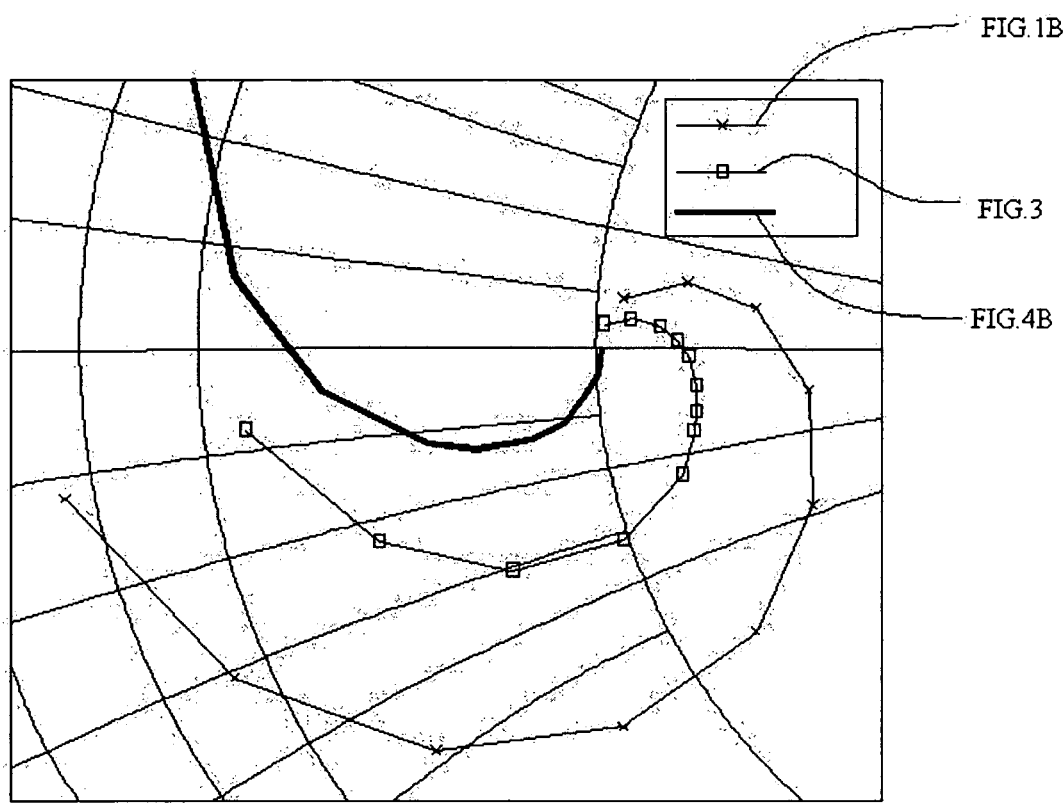
FIG. 12 is a Smith chart showing the frequency response curves in FIG. 1B, FIG. 3 and FIG. 4B.
FIG. 13 is a table showing the frequency response value of the structures in FIG. 4B, Case I, Case II, Case III and Case IV at operating frequencies 2.5 GHz, 5 GHz and 10 GHz respectively.

First, comparing the conventional single wire bonding structure (shown in FIG. 1B) and the conventional double wires bonding structure (shown in FIG. 3) with the present invention shown in FIG. 4B. FIG. 9 is a table showing the frequency response value of the structures in FIG. 1B, FIG. 3 and FIG. 4B at operating frequencies 2.5 GHz, 5 GHz and 10 GHz respectively. FIG. 10 is a graph showing the $S_{22}$ frequency response curves in FIG. 1B, FIG. 3 and FIG. 4B. FIG. 11 is a graph showing the $S_{21}$ frequency response curves in FIG. 1B, FIG. 3 and FIG. 4B. FIG. 12 is a Smith chart showing the frequency response curves in FIG. 1B, FIG. 3 and FIG. 4B.

Figure 14:
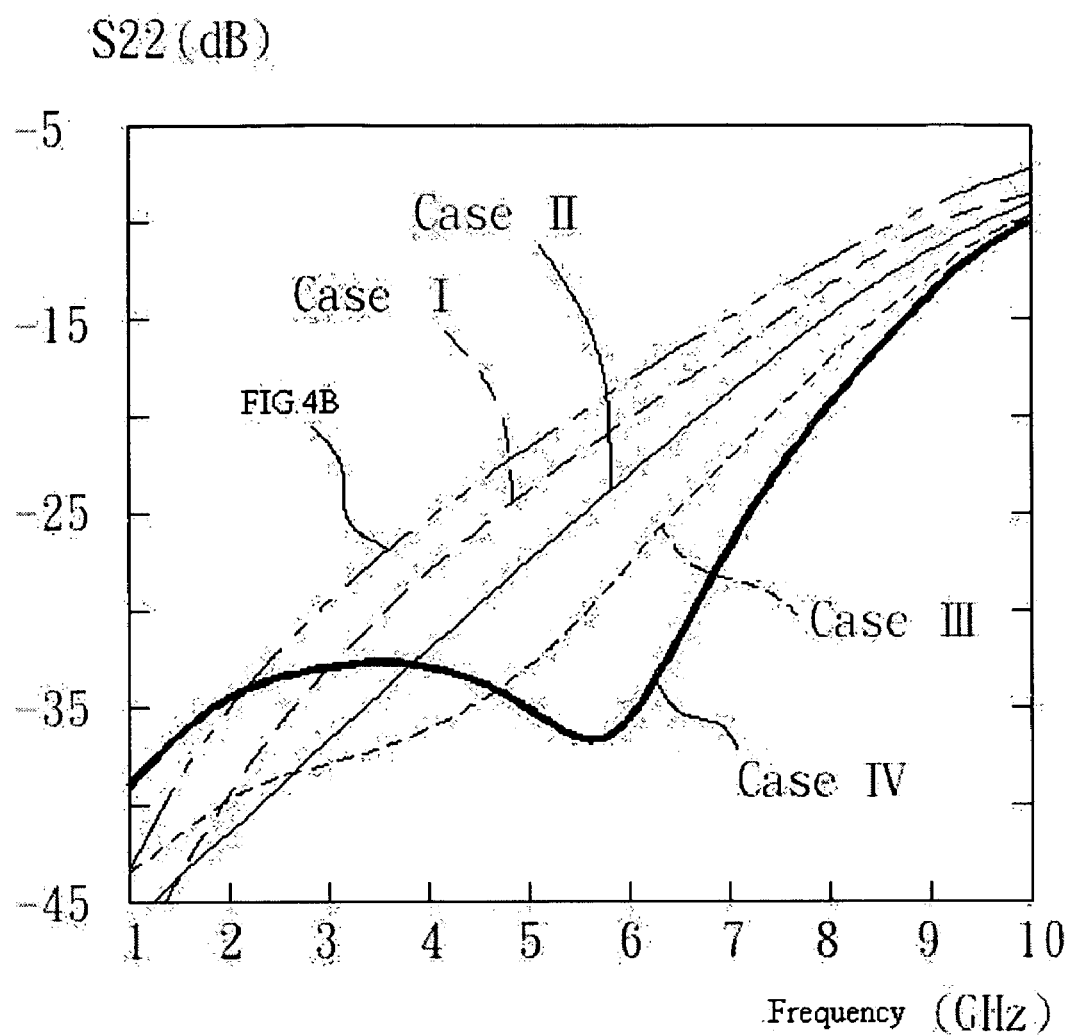
FIG. 14 is a graph showing the $S_{22}$ frequency response curves in FIG. 4B, Case I, Case II, Case III and Case IV.
Figure 15:
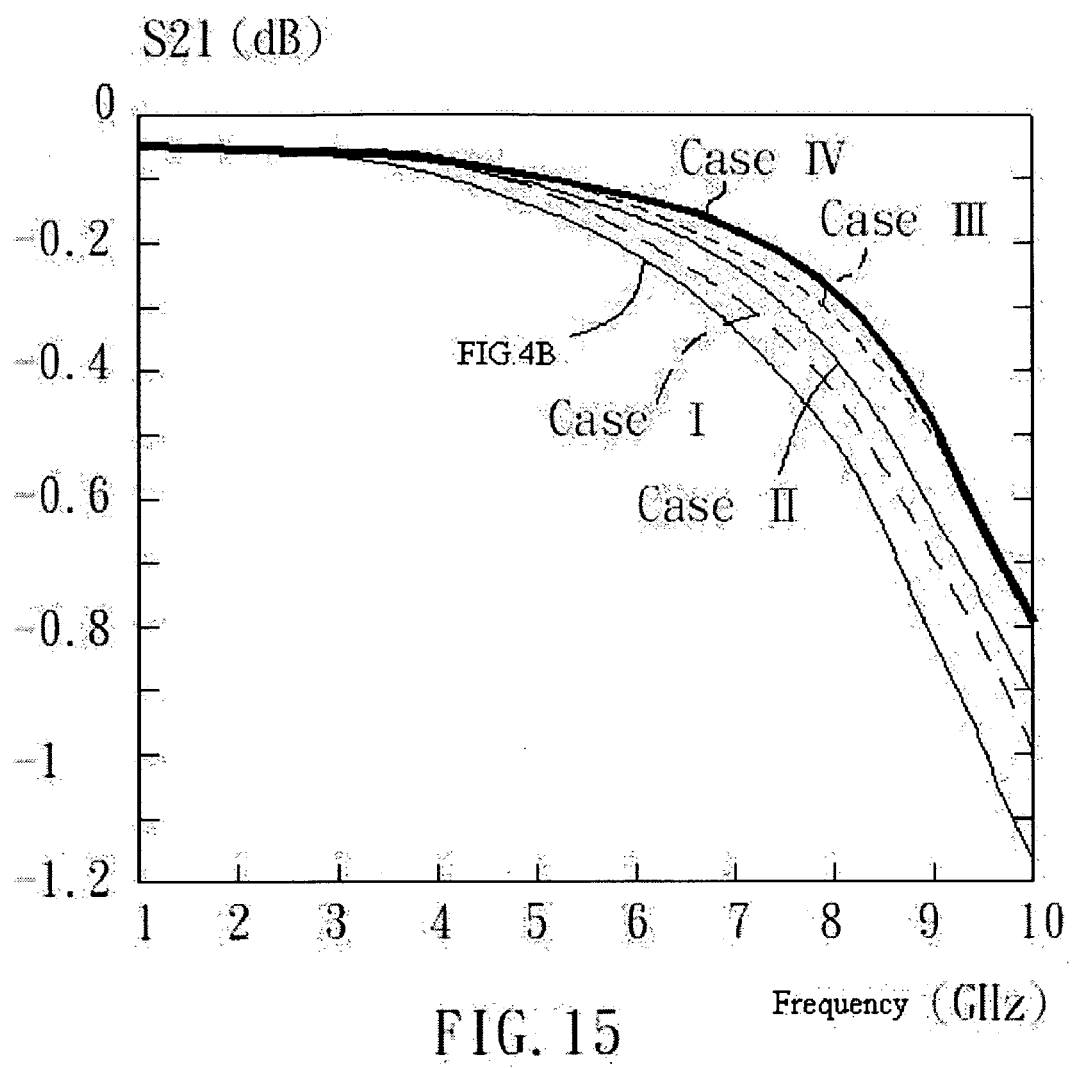
FIG. 15 is a graph showing the $S_{21}$ frequency response curves in FIG. 4B, Case I, Case II, Case III and Case IV.
Figure 16:
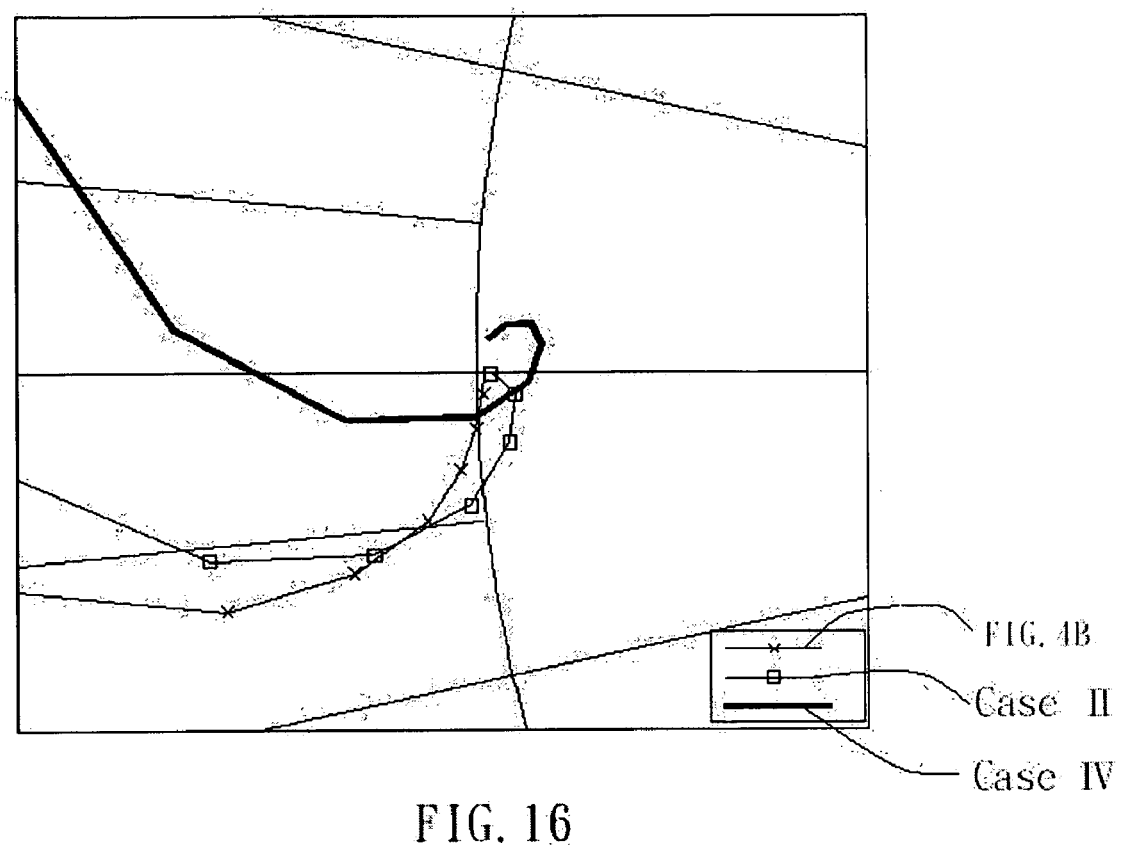
FIG. 16 is a Smith chart showing the frequency response curves in FIG. 4B, Case II and Case IV.

Then, comparing the present invention shown in FIG. 4B with four cases Case I, Case II, Case III and Case IV, in which the length L of transmission line 291 is incrementally increased while the width W3 is the same. FIG. 13 is a table showing the frequency response value of the structures in FIG. 4B, Case I, Case II, Case III and Case IV at operating frequencies 2.5 GHz, 5 GHz and 10 GHz respectively. FIG. 14 is a graph showing the $S_{22}$ frequency response curves in FIG. 4B, Case I, Case II, Case III and Case IV. FIG. 15 is a graph showing the $S_{21}$ frequency response curves in FIG. 4B, Case I, Case II, Case III and Case IV. FIG. 16 is a Smith chart showing the frequency response curves in FIG. 4B, Case II and Case IV.

In brief, because the characterized signal lead structure is fabricated with a considerable volume, a capacitive effect is easily induced to compensate for the inductive effect of characterized signal wires. A transmission line connected to the characterized signal lead structure could be used to increase the inductance to balance the over tuned capacitance of the characterized signal lead structure by adjusting the widths of the segments of the transmission line. Hence, the impedance through characterized signal wires, characterized signal structure and transmission line can approximately match the impedance of the system. Therefore, computation errors in the chip due to signal reflection are significantly minimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A lead-frame package, comprising:
    a lead frame, comprising:
        a die pad;
        a plurality of generic leads;
        a plurality of AC ground leads; and
        at least a characterized signal lead structure having a cross-sectional area perpendicular to the direction of signal transmission greater than that of each generic lead, wherein both sides of the characterized signal lead structure are the AC ground leads;
    a chip attached to the die pad;
    a plurality of generic wires connecting the chip to the generic leads respectively;
    a plurality of AC ground wires connecting at least a AC ground bonding pad on the chip to the AC ground leads respectively for transmitting at least a AC ground signal;
    at least a characterized signal wire connecting a signal bonding pad on the chip to the characterized signal lead structure for transmitting a single signal; and
    an insulation material encapsulating the lead frame, the chip, the generic wires, the AC ground wires and the characterized signal wire;
    wherein the signal bonding pad on the chip is surrounded by the AC ground bonding pad.

2. The lead-frame package of claim 1, wherein the AC ground bonding pad comprises ground bonding pad and power bonding pad, the AC ground signal comprises ground signal and power signal.

3. The lead-frame package of claim 1, wherein the lead-frame package comprises a plurality of characterized signal wires, the characterized signal lead structure comprises a plurality of characterized signal leads, each of the plurality of characterized signal leads having a profile identical to the generic lead, and the characterized signal wires connect the same signal bonding pad on the chip to the characterized signal leads respectively.

4. The lead-frame package of claim 1, wherein the characterized signal lead structure is a single block lead.

5. The lead-frame package of claim 1, wherein the lead-frame package is suitable for joining to a substrate, the substrate comprises a pad electrically connected to the characterized signal lead structure.

6. The lead-frame package of claim 5, wherein the pad is electrically connected to a transmission line of the substrate, the transmission line has characteristic of stepped impedance, the transmission line comprising:
    a first section electrically connected to the pad; and
    a second section electrically connected to the first section, wherein the first section and the second section have different impedance.

7. The lead-frame package of claim 6, wherein the width of the first section is smaller than that of the second section.

8. The lead-frame package of claim 1, wherein the lead-frame package further comprises a plurality of ground wires connected to an electrical ground, and the ground wires are connected between the chip and the die pad and positioned at both sides of the characterized signal wires.

9. An electrical connection structure for electrically connecting a chip and a substrate, comprising:
   a plurality of generic leads connected to the substrate;
   a plurality of AC ground leads connected to the substrate;
   at least a characterized signal lead structure connected to the substrate, wherein the characterized signal lead structure has a cross-sectional area perpendicular to the direction of signal transmission greater than that of each generic lead, wherein both sides of the characterized signal lead structure are the AC ground leads;
   a plurality of generic wires connecting the chip to the generic leads respectively;
   a plurality of AC ground wires connecting at least a AC ground bonding pad on the chip to the AC ground leads respectively for transmitting at least a AC ground signal; and
   at least a characterized signal wire connecting a signal bonding pad on the chip to the characterized signal lead structure for transmitting a single signal,
   wherein the signal bonding pad on the chip is surrounded by the AC ground bonding pad.

10. The electrical connection structure of claim 9, wherein the AC ground bonding pad comprises ground bonding pad and power bonding pad, the AC ground signal comprises ground signal and power signal.

11. The electrical connection structure of claim 9, wherein the electrical connection structure comprises a plurality of characterized signal wires, the characterized signal lead structure comprises a plurality of characterized signal leads, each of the plurality of characterized signal leads having a profile identical to the generic lead, and the characterized signal wires connect the same signal bonding pad on the chip to the characterized signal leads respectively.

12. The electrical connection structure of claim 9, wherein the characterized signal lead structure is a single block lead.

13. The electrical connection structure of claim 9, wherein the substrate comprises a pad electrically connected to the characterized signal lead structure.

14. The electrical connection structure of claim 13, wherein the pad is electrically connected to a transmission line of the substrate, the transmission line has characteristic of stepped impedance, the transmission line comprising:
   a first section electrically connected to the pad; and
   a second section electrically connected to the first section, wherein the first section and the second section have different impedance.

15. The electrical connection structure of claim 14, wherein the width of the first section is smaller than that of the second section.

16. A signal transmission structure using a lead frame, suitable for transmitting signal from a chip to an external circuit through the lead frame, the signal transmission structure comprising:
   at least a high frequency transmission circuit comprising a high frequency signal lead structure and at least a high frequency signal wire, wherein the chip is electrically connected to the external circuit through the high frequency signal wire and the high frequency signal lead structure, the high frequency signal wire connects a signal bonding pad on the chip to the high frequency signal lead structure for transmitting a single signal, and the high frequency signal lead structure is provided by the lead frame;
   a plurality of generic transmission circuits each comprising a generic lead and a generic wire, wherein the chip is electrically connected to the external circuit through the generic wires and the generic leads, and the generic wires connect the chip to the generic leads respectively, and the generic leads are provided by the lead frame; and
   a plurality of AC ground transmission circuits each comprising a AC ground lead and a AC ground wire, the AC ground wires connect a AC ground bonding pad on the chip to the AC ground leads respectively for transmitting a AC ground signal;
   wherein the high frequency signal lead structure has a cross-sectional area perpendicular to the direction of signal transmission greater than that of each generic lead, wherein both sides of the high frequency signal lead structure are the AC ground leads, the signal bonding pad on the chip is surrounded by the AC ground bonding pad.

17. The signal transmission lead frame structure of claim 16, wherein the AC ground bonding pad comprises ground bonding pad and power bonding pad, the AC ground signal comprises ground signal and power signal.

18. The signal transmission lead frame structure of claim 16, wherein the high frequency signal lead structure comprises a plurality of high frequency signal leads, each of the plurality of high frequency signal leads having a profile identical to the generic lead, and the high frequency transmission circuit comprises a plurality of high frequency signal wires connected the same signal bonding pad on the chip to the high frequency signal leads respectively.

19. The signal transmission lead frame structure of claim 16, wherein the high frequency signal lead structure is a single block lead.

20. The signal transmission lead frame structure of claim 16, wherein the external circuit comprises a substrate comprising a pad electrically connected with the high frequency signal lead structure.

21. The signal transmission lead frame structure of claim 20, wherein the pad is electrically connected to a transmission line of the substrate, the transmission line has characteristic of stepped impedance, the transmission line comprising:
   a first section electrically connected to the pad; and
   a second section electrically connected to the first section, wherein the first section and the second section have different impedance.

22. The signal transmission lead frame structure of claim 21, wherein the width of the first section is smaller than that of the second section.

* * * * *